United States Patent
Abnous (10) Patent No.: US 7,603,400 B2
(45) Date of Patent: Oct. 13, 2009

(54) METHOD AND SYSTEM FOR FILTER LOOP WITH SATURATION

(75) Inventor: Arthur Abnous, Irvine, CA (US)

(73) Assignee: Broadcom Corporation

( * ) Notice: Subject to any disclaimer, the term of this patent is extended or adjusted under 35 U.S.C. 154(b) by 862 days.

(21) Appl. No.: 11/187,678

(22) Filed: Jul. 22, 2005

(65) Prior Publication Data

US 2007/0019720 A1  Jan. 25, 2007

(51) Int. Cl.
G06F 17/10 (2006.01)
(52) U.S. Cl. ..................................... 708/320
(58) Field of Classification Search .............. None
See application file for complete search history.

(56) References Cited

U.S. PATENT DOCUMENTS

| | | | |
|---|---|---|---|
| 5,432,723 A * | 7/1995 | Chen et al. ............ | 708/300 |
| 6,167,415 A * | 12/2000 | Fischer et al. ........ | 708/320 |
| 6,263,354 B1 * | 7/2001 | Gandhi .................. | 708/320 |
| 6,678,709 B1 * | 1/2004 | Gandhi et al. ......... | 708/319 |
| 2003/0163501 A1 * | 8/2003 | Yang et al. ............. | 708/552 |

* cited by examiner

Primary Examiner—David H Malzahn
(74) Attorney, Agent, or Firm—McAndrews, Held & Malloy, Ltd.

(57) ABSTRACT

Methods and systems for processing a signal are disclosed herein and may comprise filtering an input signal and a plurality of saturation limit signals to generate a plurality of filtered input signals. A plurality of summed current input signals may be generated by adding the plurality of filtered input signals to a next input signal. While the summed current input signals are being generated, an saturation select signal is simultaneously determined for an output signal based on the input signal. The input signal and the plurality of saturation limit signals may be filtered utilizing infinite impulse response filter and/or finite impulse response filter.

20 Claims, 5 Drawing Sheets

METHOD AND SYSTEM FOR FILTER LOOP WITH SATURATION

RELATED APPLICATIONS

[Not Applicable]

FEDERALLY SPONSORED RESEARCH OR DEVELOPMENT

[Not Applicable]

MICROFICHE/COPYRIGHT REFERENCE

[Not Applicable]

FIELD OF THE INVENTION

Certain embodiments of the invention relate to processing of signals. More specifically, certain embodiments of the invention relate to a method and system for a filter loop with saturation.

BACKGROUND OF THE INVENTION

High-speed digital communication networks over copper and optical fiber are used in many network communication and digital storage applications. Ethernet and Fiber Channel are two widely used communication protocols, which continue to evolve in response to increasing demands for higher bandwidth in digital communication systems.

As the demand for higher data rates and bandwidth continues to increase, equipment vendors are continuously being forced to employ new design techniques for manufacturing network equipment and integrated circuits capable of handling these increased data rates and data processing requirements. For example, timely signal processing of packetized data is central to the operation of Voice over IP (VOIP) telephones and networks. In this regard, digital signal processing systems may be adapted to utilize one or more filter loops prior to transmission and/or after reception of packetized data. A filter loop may be utilized to transform an input signal and generate an output signal within a specific signal range. Conventional filter loops, however, utilize signal conversions in the circuit critical signal path, or the longest signal processing path within the filter loop. Signal format conversions within the circuit's critical path may significantly decrease the processing efficiency of Voice over IP or other digital signal processing systems.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for a filter loop with saturation, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain aspects of the invention may be found in a method and system for a filter loop with saturation. In one embodiment of the invention, an input signal and a plurality of saturation limit signals may be filtered in a first operating cycle utilizing carry-save arithmetic. Simultaneously, in a second operating cycle, the input signal may be converted to binary form and an output signal may be selected from a plurality of signals calculated in a previous operation cycle. In this regard, by utilizing two simultaneous operating cycles with a single binary conversion, signal conversions within the filter loop's critical path from carry-save to binary format, for example, may be performed in parallel with other operations. Accordingly, this results in increased signal processing efficiency of the filter loop. Furthermore, by utilizing two simultaneous operating cycles rather than a single operating cycle utilized by conventional filter loops, the filter loop signal throughput may be approximately doubled.

Figure 1:
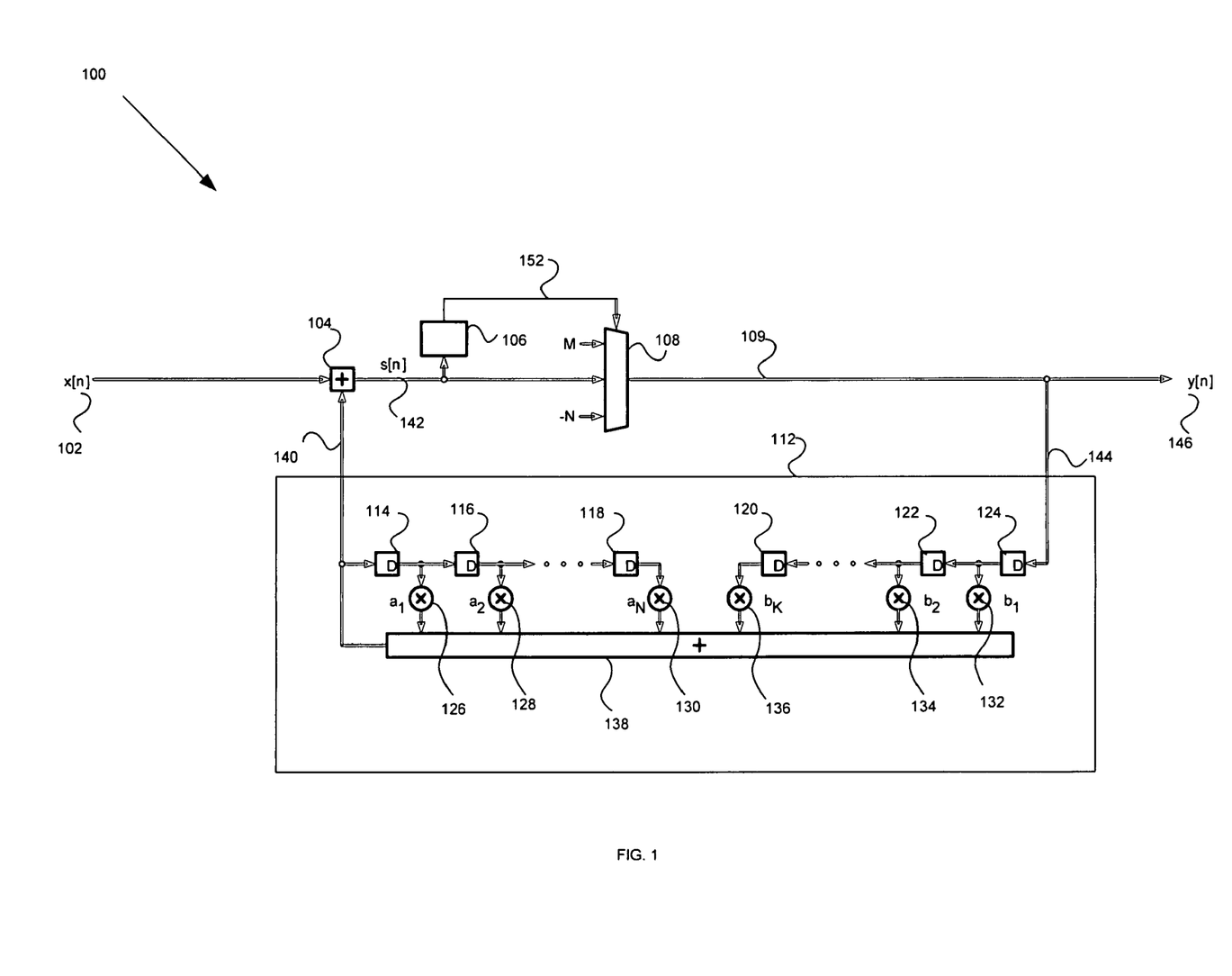
FIG. 1 is a block diagram of an exemplary filter loop, which may be utilized in accordance with an embodiment of the invention.

FIG. 1 is a block diagram of an exemplary filter loop, which may be utilized in accordance with an embodiment of the invention. Referring to FIG. 1, the filter loop 100 may comprise an adder 104, a selector 106, a multiplexer 108, and a feedback filter 112. The feedback filter 112 may be an infinite impulse response (IIR) filter and may comprise delay blocks 114, . . . , 118 and 120, . . . , 124, adder 138, and multiplier blocks 132, . . . , 136 and 126, . . . , 130. The multiplier blocks 132, . . . , 136 may utilize determined multiplier values $b_1, \ldots, b_k$, and multiplier blocks 126, . . . , 130 may utilize determined multiplier values $a_1, \ldots, a_n$. Even though an IIR filter is illustrated in FIG. 1, the present invention may not be so limited and other types of filters, such as a finite impulse response (FIR) filter may be also utilized for filtering a feedback signal.

The adders 104 and 138 may comprise suitable circuitry, logic, and/or code and may be adapted to add one or more signals and generate an output added signal. The multiplexer 108 may comprise suitable circuitry, logic, and/or code and may be adapted to select an output signal from a plurality of input signals. The delay blocks 120, . . . , 124 and 114, . . . , 118 may comprise suitable circuitry, logic, and/or code and may be adapted to delay an input signal by one operating cycle, for example. The multiplier blocks 132, . . . , 136 and 126, . . . , 130 may comprise suitable circuitry, logic, and/or code and may be adapted to multiply an input signal by a multiplier constant to generate a multiplied input.

The selector 106 may comprise suitable circuitry, logic, and/or code and may be adapted to acquire an input signal and determine whether the input signal falls within a desired range, such as [−N, M]. In one embodiment of the invention, the selector 106 may be adapted to convert the input signal into binary form prior to determining if the input signal is within a desired range.

In operation, an input signal 102 may be received by the filter loop 100 and may be communicated to the adder 104. The adder 104 may add the input signal 102 with an output signal 140 of the feedback filter 112 to generate an added signal 142. The output signal 140 may be generated by filtering a filter loop output signal 144 from a previous operation cycle. For example, the filter loop output signal 144 may be delayed by delay block 124 and then multiplied by multiplier block 132. The signal delayed by the delay block 124 may be subsequently delayed by delay block 122 and multiplied by multiplier block 134. The signal delay and multiplication process may continue for k number of times for example, utilizing a total of k number of delay blocks and k number of multiplier blocks. The signal delayed by the (k−1) delay block may be delayed by delay block 120 and multiplied by the multiplier block 136. Similarly, n number of delay blocks 114, . . . , 118 and n number of multiplier blocks 126, . . . , 130 may be utilized to process a feedback signal of the filter output signal 140 generated by the adder 138. The adder 138 may then add the resulting (k+n) multiplied signals to generate the filter output signal 140.

The added signal 142 may then be communicated to the selector 106. The selector 106 may convert the added signal 142 into binary form and may determine a multiplexer selector signal that may be used by multiplexer 108 so that the output of multiplexer 108, signal 109, may be within a desired range, such as [−N, M]. The added signal 142 may be selected when the added signal 142 is already within the desired range [−N, M]. If the added signal 142 is less than −N, −N may be selected, and if the added signal 142 is greater than M, M may be selected.

In an exemplary operating cycle, the critical signal path within the filter loop 100 may start with the first delay block 124 of the feedback filter 112 and may continue through the remaining delay and multiply blocks, the adder 138, the input adder 104, the selector 106, and the multiplexer 108. In one embodiment of the invention, the processing speed within the filter loop 100 may be improved by utilizing carry-save arithmetic to perform the multiplication and addition operations within the feedback filter 112, as well as the addition operations within adders 104. However, the selector 106 may be adapted to convert the input signal into binary format in order to determine the multiplexer select 152, which may result in decreased signal processing speed within the signal's critical path of the filter loop 100.

Figure 2:
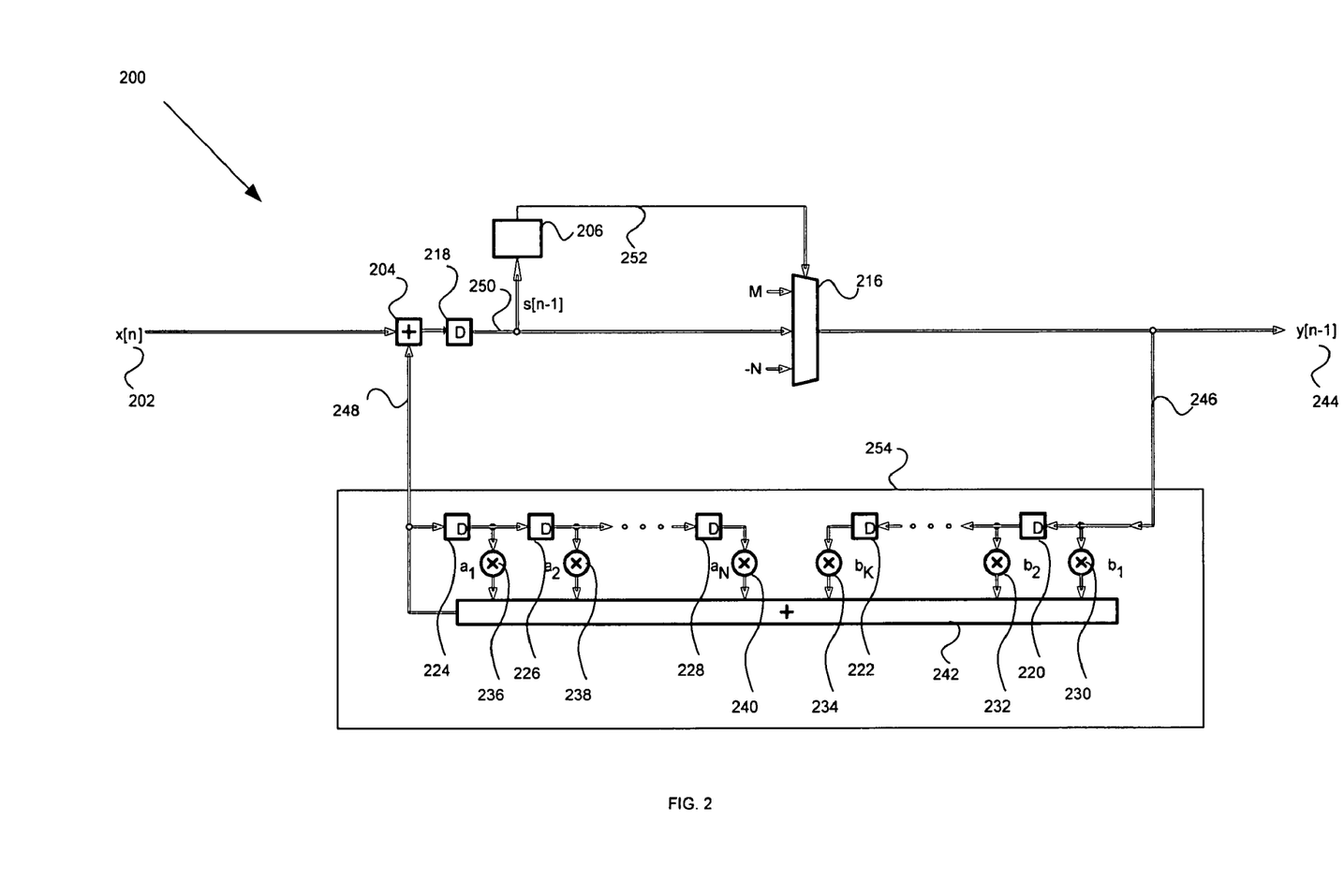
FIG. 2 is a block diagram of an exemplary filter loop with a delayed output, in accordance with an embodiment of the invention.

FIG. 2 is a block diagram of an exemplary filter loop with a delayed output, in accordance with an embodiment of the invention. Referring to FIG. 2, the filter loop 200 may comprise adder 204, a selector 206, a multiplexer 216, a delay block 218, and a feedback filter 254. The feedback filter 254 may be an infinite impulse response (IIR) filter and may comprise delay blocks 220, . . . , 222 and 224, . . . , 228, adder 242, and multiplier blocks 230, . . . , 234 and 236, . . . , 240. The multiplier blocks 230, . . . , 234 may utilize determined multiplier values $b_1, \ldots, b_k$, and multiplier blocks 236, . . . , 240 may utilize determined multiplier values $a_1, \ldots, a_n$. Even though an IIR filter is illustrated in FIG. 2, the present invention may not be so limited and other types of filters, such as a finite impulse response (FIR) filter may be also utilized for filtering a feedback signal.

The adders 204, and 242 may comprise suitable circuitry, logic, and/or code and may be adapted to add one or more signals and generate an output added signal. The multiplexer 216 may comprise suitable circuitry, logic, and/or code and may be adapted to select an output signal from a plurality of input signals. The delay blocks 218, . . . , 228 may comprise suitable circuitry, logic, and/or code and may be adapted to delay an input signal by one operation cycle, for example. The multiplier blocks 230, . . . , 240 may comprise suitable circuitry, logic, and/or code and may be adapted to multiply an input signal by a multiplier constant to generate a multiplied input.

Referring to FIGS. 1 and 2, the filter loop 100 may be modified to obtain filter loop 200 by moving the delay block 124 from the feedback filter 112 to a location within a signal path comprising the initial signal adder 204. For example, a first delay block within the filter 254 may be utilized as a delay block 218. The delay block 218 may be adapted to delay the output of the initial signal adder 204. In this regard, a previously filtered signal 248, generated by the feedback filter 254, may be utilized to generate the current delayed output signal 244.

The selector 206 may comprise suitable circuitry, logic, and/or code and may be adapted to acquire an input signal and determine whether the input signal falls within a desired range, such as [−N, M]. In one embodiment of the invention, the selector 306 may be adapted to convert the input signal into binary form prior to determining if the input signal is within a desired range.

In one embodiment of the invention, the filter loop 200 may be similar in operation to the filter loop 100 of FIG. 1. However, a single delay block, such as the delay block 218 may be removed from the feedback filter 254 and may be placed after the input adder 204. In this regard, an input added signal generated by the input adder 204 may be delayed by one operating cycle, thereby generating delayed added signal 250. Furthermore, a delayed output signal 244 may be generated based on the delayed added input signal 250, M, −N, and the selector output signal 252. By removing the delay block 218 from the feedback filter 254 and inserting it within the signal's critical path after the input adder 204, pre-calculation of filtered entries may be achieved within the feedback filter 254, utilizing carry-save arithmetic.

Figure 3:
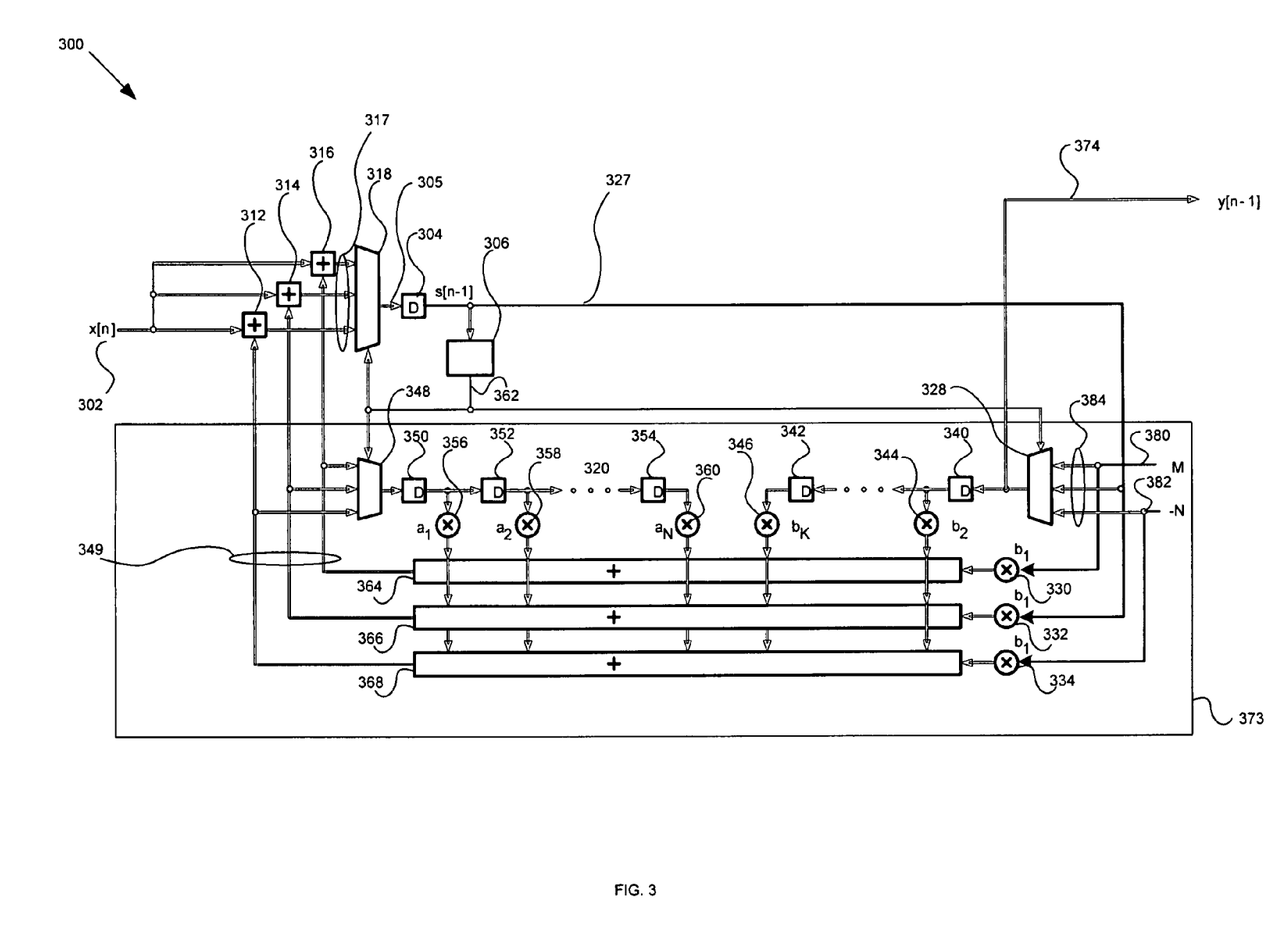
FIG. 3 is a block diagram of an exemplary filter loop, which may be utilized in accordance with an embodiment of the invention.

FIG. 3 is a block diagram of an exemplary filter loop, which may be utilized in accordance with an embodiment of the invention. Referring to FIG. 3, the filter loop 300 may comprise adders 312, . . . , 316, a selector 306, a delay block 304, a multiplexer 318, and a feedback filter 373. The feedback filter 373 may be an infinite impulse response (IIR) filter and may comprise delay blocks 340, . . . , 342, and 350, . . . , 354, adders 364, . . . , 368, multiplier blocks 330, . . . , 334, 344, . . . , 346, and 356, . . . , 360, and multiplexers 348 and 328. The multiplier blocks 330, . . . , 334 may utilize multiplier constant $b_1$, multiplier blocks 344, . . . , 346 may utilize determined multiplier values $b_2, \ldots, b_k$, and multiplier blocks 356, . . . , 360 may utilize determined multiplier values $a_1, \ldots, a_n$. Even though an IIR filter is illustrated in FIG. 3, the present invention may not be so limited and other types of filters, such as a finite impulse response (FIR) filter may be also utilized for filtering a feedback signal.

A next input signal 302 to the filter loop 300 and output signals 349 of the feedback filter 373 may be communicated as inputs to the adders 312, . . . , 316. The outputs of the adders 312, . . . , 316 may be coupled as inputs to the multiplexer 318. The output of the multiplexer 318 may be coupled to an input of the delay block 304. The output of the delay block 304 may be coupled to an input of the selector 306, as well as to inputs of the filter 373. The output of the selector 306 may be coupled to the multiplexers 328, 348, and 318. The range limits of −N and M may be coupled to the inputs of the filter 373. Within the feedback filter 373, the inputs to the filter 373 may be coupled to the inputs of the multiplexer 328 and to the multiplier blocks 330, ..., 334. The output of the multiplexer 328 may be communicated as filter loop output 374 and may be also delayed by delay blocks 340, ..., 342. The delayed signal may be multiplied by the multiplier blocks 344, ..., 346 and added by the adders 364, ..., 368. Furthermore, the outputs 349 of the adders 364, ..., 368 may be coupled to the inputs of the multiplexer 348. The output of the multiplexer 348 may be coupled to the delay blocks 350, ..., 354 and the multiplier blocks 356, ..., 358.

The adders 312, ..., 316, and 364, ..., 368 may comprise suitable circuitry, logic, and/or code and may be adapted to add one or more signals and generate an output added signal. The multiplexers 318, 328, and 348 may comprise suitable circuitry, logic, and/or code and may be adapted to select an output signal from a plurality of input signals. The delay blocks 304, 340, ..., 342, and 350, ..., 354 may comprise suitable circuitry, logic, and/or code and may be adapted to delay an input signal by one operating cycle, for example. The multiplier blocks 330, ..., 334, 344, ..., 346, and 356, ..., 360 may comprise suitable circuitry, logic, and/or code and may be adapted to multiply an input signal by a multiplier constant to generate a multiplied input.

The selector 306 may comprise suitable circuitry, logic, and/or code and may be adapted to acquire an input signal and determine whether the input signal falls within a desired range, such as [−N, M]. In one embodiment of the invention, the selector 306 may be adapted to convert the input signal into binary form prior to determining if the input signal is within a desired range.

In operation, the filter loop 300 may be adapted to pre-compute a plurality of signals 317, and signal output 327, within a signal's critical path, utilizing a single next input signal 302 and a plurality of pre-calculated filtered signals from a previous operating cycle 349. The critical signal path within the filter loop 300 may comprise the delay block 304, the multiplier blocks 330, ..., 334, the adders 364, ..., 368, the adders 312, ..., 316, and the multiplexer 318. Simultaneously with the pre-calculation operation, a selector 306 may be utilized to convert an added signal input 327 into binary form and determine if it falls within a desired range, such as [−N, M]. A filter loop output 374 may then be selected from the signals communicated to the multiplexer 328 utilizing the output signal 362 of the selector 306.

A summed input signal 305, which is generated based on a next input signal 302, may be delayed by the delay block 304. The delayed summed input signal may be communicated to the selector 306. The selector 306 may convert the delayed summed input signal into binary form and may determine a multiplexer selector signal 362 that may be used by multiplexer 328, so that the output of multiplexer 328 may be within a desired range, such as [−N, M]. Added delayed summed signal 327 may be selected when the delayed summed input signal 327 is already within the desired range [−N, M]. If the delayed summed input signal is less than −N, −N may be selected, and if the delayed summed input signal is greater than M, M may be selected. After the selector 306 determines whether signal 327 falls within the desired range of [−N, M], the multiplexer select signal 362 may be communicated to the multiplexers 328, 348, and 318.

Referring to FIGS. 2 and 3, the filter loop 200 may be further enhanced by including additional components comprising multiplier blocks 332, ..., 334, adders 312, ..., 314, 366, ..., 368, and multiplexers 318 and 348. These additional components may be utilized to pre-compute a plurality of signals 317, and signal output 327, within a signal's critical path, utilizing a single next input signal 302 and a plurality of pre-calculated filtered signals from a previous operating cycle 349.

Simultaneously with the determination of the multiplexer select signal 362 by the selector 306, the summed input signal 327, the upper range limit signal 380, and the lower range limit signal 382, may be communicated to the multiplexer 328 within the filter 373, as well as to the multipliers 330, ..., 334. At the time the multiplexer selector signal 362 is generated, the multiplexer 328 may select a filter loop delayed output signal 374 from the plurality of input signals 384 based on the multiplexer selector signal 362 determined by the selector 306. Furthermore, the multiplexer selector signal 362 may be also communicated to the multiplexers 318 and 348 for selection of a filtered input signal from the filter output signals 349 and a corresponding selection of a summed input signal 305 from the plurality of summed current input signals 317. The selected summed input signal 305 from the plurality of summed current input signals 317 may be delayed by the delay block 304 and may be utilized to generate a delayed filter loop output signal for a subsequent operating cycle.

Figure 4:
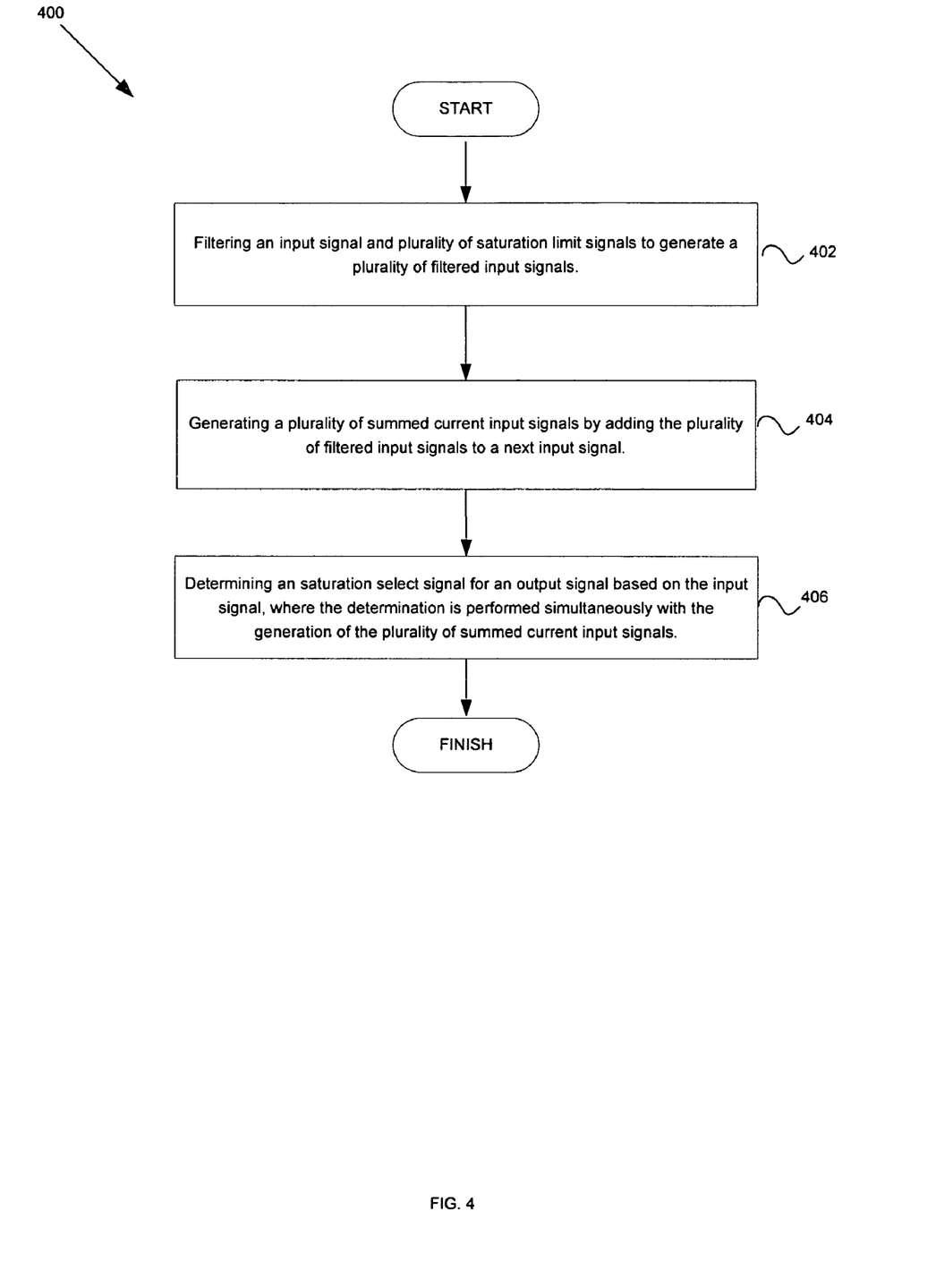
FIG. 4 is a flow diagram of exemplary steps for processing signals, in accordance with an embodiment of the invention.

FIG. 4 is a flow diagram of exemplary steps for processing signals, in accordance with an embodiment of the invention. Referring to FIG. 4, at 402, the input signal and a plurality of saturation limit signals may be filtered to generate a plurality of filtered input signals. At 404, a plurality of summed current input signals may be generated by adding the plurality of filtered input signals to a next input signal. At 406, a multiplexer select signal may be determined for an output signal based on the input signal. The determination is performed simultaneously with the generation of the plurality of summed current input signals.

Referring again to FIG. 3, a plurality of input signals 380 may be filtered to generate a plurality of filtered input signals 349. A plurality of summed current input signals 317 may be generated by adding the plurality of filtered input signals 349 to a next input signal 302. The plurality of filtered input signals 349 may be added to the next input signal 302 via the adders 312, ..., 316. The summed current input signals 317 may be communicated to the multiplexer 318 and a summed input signal 305 may be selected by the multiplexer 318 when the multiplexer select signal 362 is determined by the selector 306. Simultaneously with the determination of the plurality of summed current input signals 317, the selector 306 may determine the multiplexer select signal 362 for an output signal based on the delayed summed input signal 327.

In one embodiment of the invention, a method for processing a signal may comprise filtering an input signal 327 and a plurality of saturation limit signals 380, ..., 382, to generate a plurality of filtered input signals 349. The plurality of filtered input signals 349 may be added to a next input signal 302 to generate a plurality of summed current input signals 317. The summed input signal 305 may be selected by multiplexer 318 from the plurality of summed current input signals 317. The summed input signal 305 may be delayed by the delay block 304 to generate the input signal 327 for the subsequent cycle. Simultaneously with the generating of summed current input signals 317 from input signals 384, a saturation select signal 362 is determined by the selector 306 based on input signal 327. The saturation select signal 362 generated by the selector 306 based on input signal 327 may be used by multiplexer 328 to select an output signal 374 from a plurality of input signals 384.

In one embodiment of the invention, the filter 373 may be an infinite impulse response (IIR) filter. The plurality of summed current input signals 317 may be generated using carry-save addition to add filtered input signals 349 to a next input signal 302. The selector 306 may convert an input signal 327 into binary form to generate a saturation select signal 362. Simultaneously with selection of output signal 327 by multiplexer 328 based on saturation select signal 362, summed input signal 305 may be selected by multiplexer 318 based on saturation select signal 362. The plurality of saturation limit signals 380, . . . , 382 utilize a plurality of saturation limit values, comprising of at least a minimum saturation value and a maximum saturation value.

Figure 5:
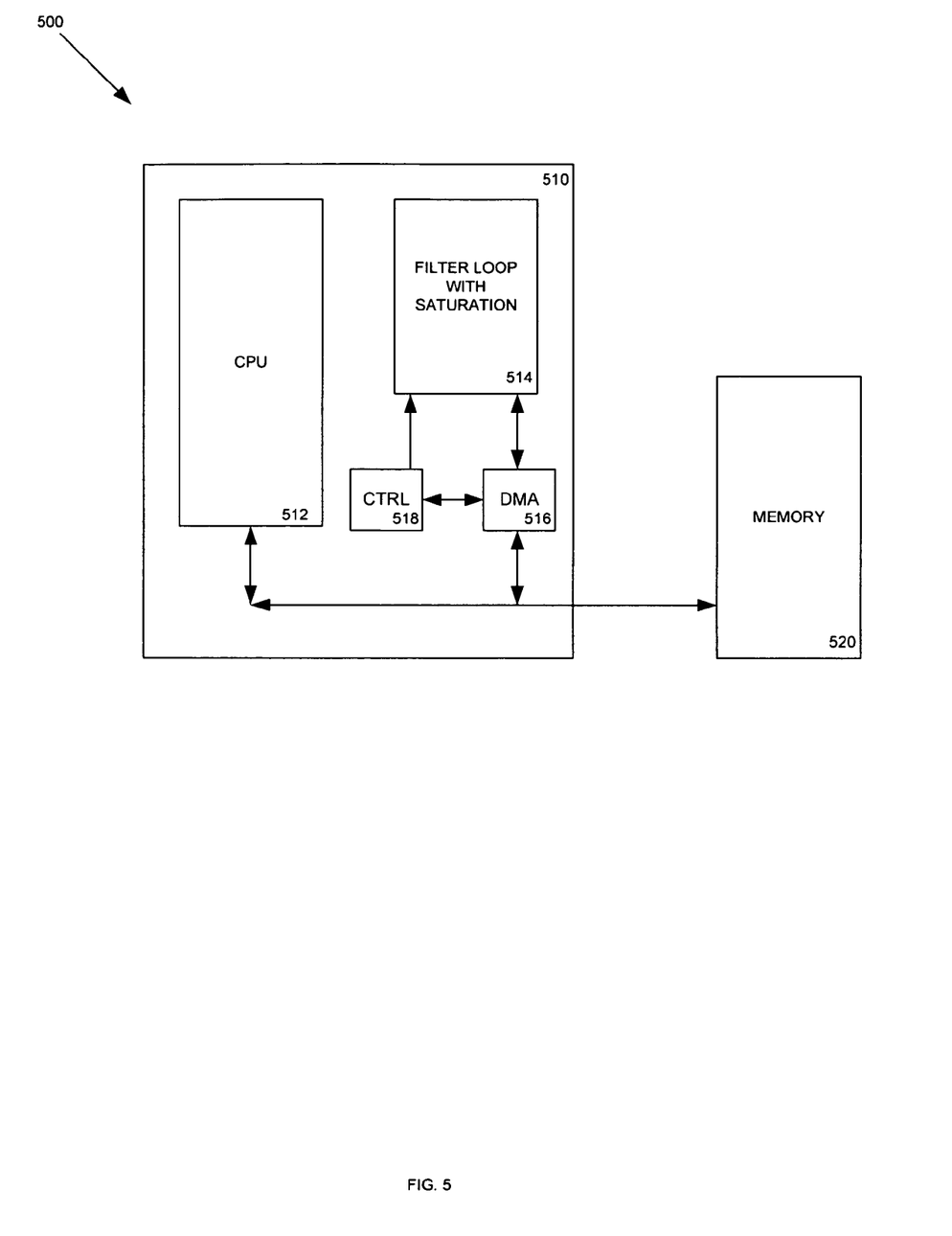
FIG. 5 is an block diagram of an exemplary signal processing system for filtering data, in accordance with an embodiment of the invention.

FIG. 5 is an block diagram of an exemplary signal processing system for filtering data, in accordance with an embodiment of the invention. Referring to FIG. 5, the exemplary system 500 may comprise an integrated circuit 510 and memory 520. The memory may be contained within the integrated circuit 510. The integrated circuit 510 may comprise of a CPU core 512, a filter loop with saturation block 514, a direct memory access block DMA 516, and a control block CTRL 518. The CPU core 512 may be a digital signal processor (DSP).

In one embodiment of the invention, the CPU core 512 may configure the control block CTRL 518, DMA block 516, and filter loop with saturation block 514 to filter data stored in memory 520. In operation, the DMA block 516 may transfer data from the memory 520 to the filter loop with saturation block 514, where the data may be filtered, and transferred back to the DMA block 516. The DMA block 516 may store the filtered data back to memory 520. The control block CTRL 518 may monitor the operation of the DMA block 516 and may notify CPU core 512 when a filtering operation on a set of data in memory 520 is completed. In this embodiment of the invention, the computationally intensive filtering operations and data transfer operations are offloaded from CPU core 512.

Accordingly, aspects of the invention may be realized in hardware, software, firmware or a combination thereof. The invention may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present invention may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The present invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for processing a signal, the method comprising:
  performing by one or more processors and/or circuits integrated within a single chip:
    filtering an input signal and a plurality of saturation limit signals to generate a plurality of filtered input signals;
    generating a plurality of summed current input signals by adding said plurality of filtered input signals to a next input signal; and
    simultaneously with said generating, determining a saturation select signal for an output signal based on said input signal, wherein said input signal is at least generated from said next input signal.

2. The method according to claim 1, comprising filtering said input signal and a plurality of saturation limit signals, utilizing one or both of an infinite impulse response (IIR) filter and/or a finite impulse response (FIR) filter.

3. The method according to claim 1, comprising adding said plurality of filtered input signals to said next input signal via carry-save addition, to generated said plurality of summed current input signals.

4. The method according to claim 1, wherein said input signal comprises a delayed input signal.

5. The method according to claim 1, comprising converting said input signal into a binary form to generate a binary input signal.

6. The method according to claim 5, comprising determining said saturation select signal for said output signal based on said generated binary input signal.

7. The method according to claim 6, comprising selecting said output signal from said input signal and said plurality of saturation limit signals based on said determined saturation select signal.

8. The method according to claim 7, comprising selecting a subsequent input signal from said plurality of summed current input signals based on said selection of said output signal, wherein said selection of said subsequent summed input signal is performed simultaneously with said selection of said output signal.

9. The method according to claim 1, wherein said saturation limit signals utilize a plurality of saturation limit values.

10. The method according to claim 9, wherein said saturation limit values comprise one of both of a minimum saturation value and/or a maximum saturation value.

11. A system for processing a signal, the system comprising:
- circuitry for filtering an input signal and a plurality of saturation limit signals to generate a plurality of filtered input signals;
- circuitry for generating a plurality of summed current input signals by adding said plurality of filtered input signals to a next input signal; and
- circuitry for simultaneously determining a saturation select signal for an output signal based on said input signal while said circuitry generates said plurality of summed current input signals, wherein said input signal is at least generated from said next input signal.

12. The system according to claim 11, wherein said circuitry for filtering filters said input signal and a plurality of saturation limit signals utilizing one or both of an infinite impulse response (IIR) filter and/or a finite impulse response (FIR) filter.

13. The system according to claim 11, wherein said circuitry for generating said plurality of summer current input signals adds said plurality of filtered input signals to said next input signal via carry-save addition, to generate said plurality of summed current input signals.

14. The system according to claim 11, wherein said input signal comprises a delayed input signal.

15. The system according to claim 11, comprising circuitry for converting said input signal into a binary form to generate a binary input signal.

16. The system according to claim 15, wherein said circuitry for determining determines said saturation select signal for said output signal based on said generated binary summed input signal.

17. The system according to claim 16, comprising circuitry for selecting said output signal from said input signal and said plurality of saturation limit signals based on said determined saturation select signal.

18. The system according to claim 17, comprising circuitry for selecting a subsequent input signal from said plurality of summed current input signals based on said selection of said output signal, wherein said selection of said subsequent summed input signal is performed simultaneously with said selection of said output signal.

19. The system according to claim 1, wherein said saturation limit signals utilize a plurality of saturation limit values.

20. The system according to claim 19, wherein said saturation limit values comprise one of both of a minimum saturation value and/or a maximum saturation value.

* * * * *